United States Patent [19]

Kowalski

[11] 4,007,479
[45] Feb. 8, 1977

[54] FIXTURE FOR AN INTEGRATED CIRCUIT CHIP

[75] Inventor: John L. Kowalski, Phoenix, Ariz.

[73] Assignee: Honeywell Information Systems, Inc., Phoenix, Ariz.

[22] Filed: Mar. 29, 1976

[21] Appl. No.: 671,238

[52] U.S. Cl. .................................. 357/70; 357/69; 357/74; 317/101 CC; 174/52 FP; 339/176 MP

[51] Int. Cl.² .................... H01L 23/48; H02B 1/04; H01R 13/50

[58] Field of Search ........................ 357/69, 70, 74; 174/52 FP; 317/101 CC; 339/176 MP

[56] References Cited

UNITED STATES PATENTS

| 3,823,350 | 7/1974 | Stoner | 357/70 |
| 3,912,983 | 10/1975 | Lowry | 357/70 |

Primary Examiner—Edward J. Wojciechowicz
Attorney, Agent, or Firm—Edward W. Hughes; William W. Holloway, Jr.

[57] ABSTRACT

A fixture for a segment of a film strip having a flexible beam lead frame mounted on the segment and an integrated circuit chip bonded to inner portions of the leads of the lead frame. The fixture is provided with an aperture so that when a segment is held by the fixture, the aperture provides access to the integrated circuit chip and a portion of the lead frame so that the chip and a part of the lead frame may be removed from the fixture prior to the chip being mounted on a substrate. The fixture protects the chip and its lead frame from damage during various manufacturing processes such as testing, sorting, and accumulating the proper number and types of chips prior to their being mounted on a substrate while facilitating automation of these processes.

22 Claims, 10 Drawing Figures

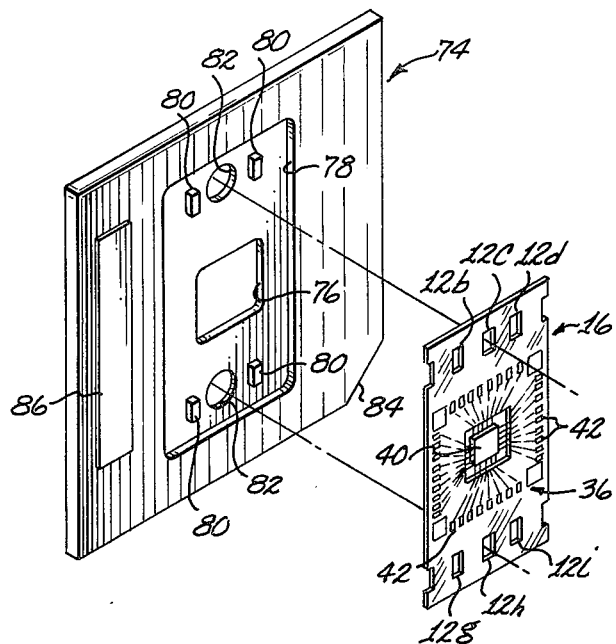
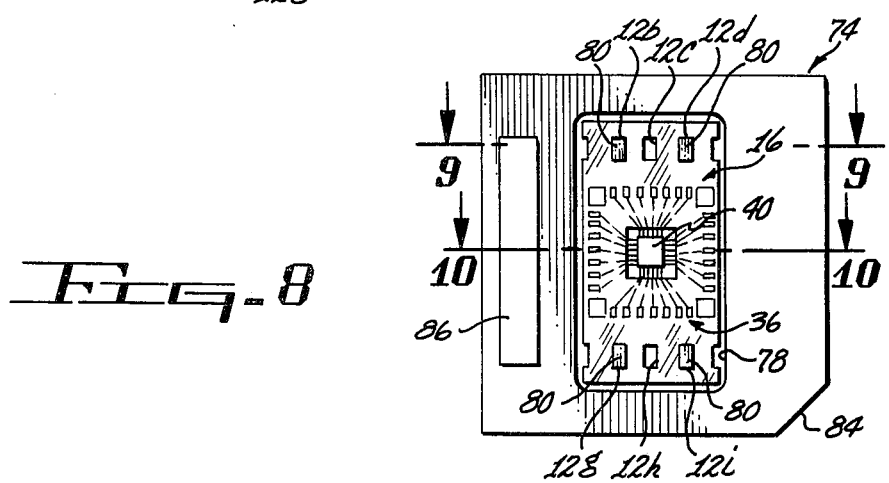
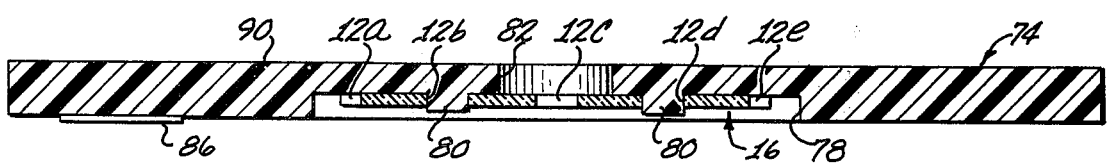
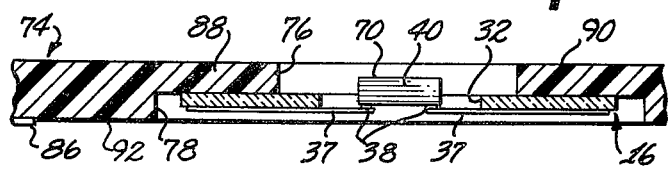

FIXTURE FOR AN INTEGRATED CIRCUIT CHIP

BACKGROUND OF THE INVENTION

1. Field of the Invention

This invention is in the field of devices for holding a segment of a strip of material on which has been formed a flexible beam lead and to which lead an integrated circuit chip is bonded. The fixture, or holder, is dimensioned to hold one segment of a film strip. Once a segment is attached to, or held by, the fixture, the fixture protects the chip and its lead frame from being damaged during subsequent manufacturing steps but permits the chip and a portion of its lead frame to be removed from the segment while the segment is held by the fixture.

2. Description of the Prior Art

The development of integrated circuit chips, particularly medium and large scale integrated circuit chips, has created a need for improved manufacturing processes which lend themselves to automating the connecting of conductive flexible leads of a lead frame to an integrated circuit (IC) chip and of such chips and part of their lead frame to substrates or into packages to connect the chips into electrical circuits. It is known to use a relatively long tapelike carrier, similar to standard motion picture film, to which is bonded a thin metallic layer of a suitable electrical conductor such as copper, nickel, or aluminum. The metallic layer can be formed into a lead frame of a desired configuration by a conventional photoetching process. Subsequently, IC chips are bonded to the lead frames. The prior art also teaches excising a chip and a portion of its lead frame directly from a substantially continuous strip of such film or tape. The length of such strips is such that to facilitate handling and shipping. The strips can be wound on reels in a similar manner as motion picture film. For more information concerning the prior art, reference is made to an article by Lyman, J., *Special Report: Film Carriers Star in High-Volume IC Production* in Electronics Vol. 48, No. 26, p. 61–68, Dec. 25, 1975; and an article by Dehaine, G. and Kurzwich, K., *Tape Automated Bonding Moving into Production* in Solid State Technology, Vol. 18, No. 10, p. 46–52, Oct., 1975.

SUMMARY OF THE INVENTION

The present invention provides fixtures which can be used to hold a segment of a strip of film on which an integrated circuit chip has been bonded to a lead frame which frame is in turn attached to the segment. An inner portion of the lead frame extends over a window formed in the segment of film and the integrated circuit chip is bonded to this inner portion. Each fixture is provided with an aperture within which are integrated circuit chip mounted on a segment is located when the segment is properly positioned in the fixture. The thickness of the substantially planar material from which the fixture is made is chosen so that the IC chip and the portions of the lead frame extending over the window of a segment is within the outermost planar surfaces of the fixture and, thus, are protected from inadvertently being physically damaged during various manufacturing process. The fixture is provided with means for retaining the segment of the film strip and with access openings so that reference sprocket holes of the film segment are accessible since access to the reference sprocket holes is required to accurately and positively position, or locate, the chip and a part of its lead frame prior to their being removed from the fixture.

The reference sprocket holes determine the reference axes used in the manufacturing steps of forming a window in a segment of a film strip, in forming the lead frame, and in bonding a chip to a lead frame. When a chip and a portion of the lead frame are removed from a segment, so that the chip can be mounted on a substrate for example, the reference sprocket holes are used so that the leads of a frame can be severed at the correct locations and so that the chip will not be damaged during this step.

The prior art has taught mounting of chips on flexible beam lead frames attached to a relatively long strip of film and winding the film strip with chips attached onto reels, for example. After a large number of chips, of generally the same type, are mounted on their lead frames and a reel of them has been produced, the chips can be tested while on the film strip to determine if they satisfy all pertinent specifications and to determine if the electrical connections between the frame and the chip are within specifications. The prior art also teaches removing a chip and a portion of the lead frame in proximity to a chip directly from such a substantially long continuous strip of chips just prior to the chips being placed into a package or onto a substrate. However, where a large number of different types of chips are to be mounted on a substrate, for example, the use of a reel of chips as the source for each different type of chip does not lend itself to economical automation of the process. The foregoing direct from reel to substrate approach has the further drawback that a chip, if it is defective, remains on the reel until it is ready to be mounted. As a result, bad chips cannot be segregated from acceptable ones without removing the frame or segment of the film to which it is attached and consequent resplicing of the tape or film. Splicing a strip of film is a step which increases costs and the possibility of damage to other chips mounted on the strip of film.

The problems of the prior art are solved by the invention, a fixture, which holds a segment of a film strip. An individual segment is formed by cutting or slicing a film strip consisting of numerous such segments at the boundaries between segments. An IC chip is bonded to the lead frame attached to each such segment. Such fixtures have other advantages such as that a chip can be tested while being held by its fixture. After being tested, the chips in their fixtures can be segregated between those that are acceptable and those which are not acceptable. Such fixtures also provide means for handling individual chips during various manufacturing steps while minimizing the risk that a chip and its lead frame can be damaged during such handling. A further advantage of the use of a fixture for each chip is that the chips held by these fixtures can be assembled in a suitable holder or magazine in groups of the right number and types for mounting on a given type of substrate. The fixtures of this invention simplify automating the production of electronic circuits, with a concomittant reduction in cost and an increase in the quality of the end product.

It is, therefore, an object of this invention to provide a fixture for a segment of a strip of film on which has been formed a flexible lead frame and onto which lead frame has been bonded an integrated circuit chip.

It is a further object of the invention to provide a fixture which protects the chip and the lead frame of a segment from damage while held by the fixture.

It is a still further object of the invention to provide a fixture which permits IC chips mounted on a segment of film to be tested so that acceptable and unacceptable chips can be easily segregated.

It is yet another object of this invention to provide a fixture for a segment of film to which is bonded an IC chip that facilitates collecting chips of the proper type in the proper number prior to their being mounted on a substrate, and which facilitates automating the process of mounting chips onto substrates.

BRIEF DESCRIPTION OF THE DRAWINGS

Other objects, features and advantages of the invention will be readily apparent from the following description of certain preferred embodiments thereof taken in conjunction with the accompanying drawings, although variations and modifications may be affected without departing from the spirit and scope of the novel concepts of the disclosure, and in which:

FIG. 7 is an isometric view of a modified form of the invention with the segment exploded therefrom;

FIG. 8 is a plan view of the fixture of FIG. 7.

FIG. 9 is an enlarged sectional view taken along line 9—9 of FIG. 8; and

FIG. 10 is an enlarged fragmentary sectional view taken on line 10—10 of FIG. 8.

DESCRIPTION OF THE PREFERRED EMBODIMENT

Figure 1:
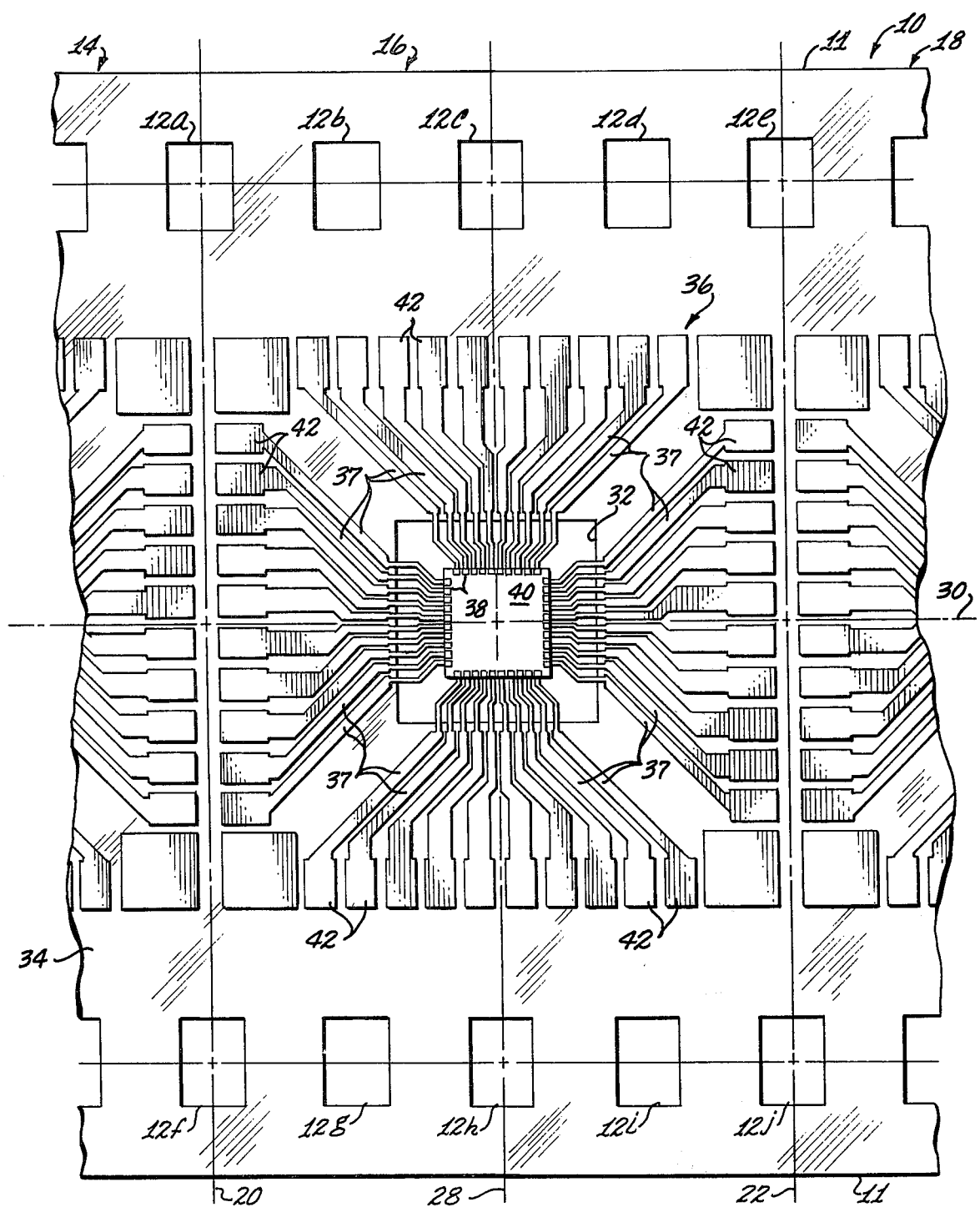
FIG. 1 is a plan view of a portion of a strip of film showing details of a segment.

Referring to FIG. 1, film strip, or carrier 10, is made of a flexible material of substantially uniform thickness and having substantially planar upper and lower surfaces. The edges 11 of strip 10 are substantially parallel. Sprocket holes, or perforations 12 are formed in two rows substantially parallel to the edges 11 of film strip 10. The location and size of sprocket holes 12 are precisely controlled. Film strip 10 is divided into a plurality of segments 14, 16 and 18. The boundaries between segments 14, 16 and 18 are indicated by dotted lines 20, 22. In each segment, such as segment 16, one of the sprocket holes or perforations, such as sprocket hole 12c in the upper row, and sprocket hole 12h in the lower row are the reference, or datum, sprocket holes. The centers of holes 12c, 12h determine the Y axis 28 and the X axis 30 of segment 16, since axis 30 is the perpendicular bisector of the segment of line 28 determined by the centers of the reference sprocket holes 12c and 12h. Window, or opening, 32 is formed in segment 16 of film strip 10 with, in a preferred example, the center of window 32 substantially coincides with the intersection of axes 28, 30. While window 32 is illustrated as being square, any suitable shape and dimension appropriate for the size and shape of an integrated circuit chip bonded to the lead frame attached to the segment is suitable.

The upper surface, 34, of film strip 10 initially has bonded to it a layer of conductive material such as copper of substantially uniform width and thickness. This layer is normally located between the rows of sprocket holes 12. Lead frame 36 is preferably formed from this layer by a conventional photoetching process and comprises a plurality of separate conductors, or leads 37, the inner portions of which are bonded to terminals 38 of an integrated circuit chip 40. The outer portions of leads 37 are affixed to film strip 10 within segment 16. It should be noted that the inner portions of the leads 37 of lead frame 36 extend over window 32 of segment 16.

The outer portions of each lead 37 of frame 36 terminates in a test pad 42. The size of pads 42 is chosen so that test probes of a testing device, which is not illustrated, can readily make a good electrical contact with the pads. In this manner it is possible to determine if leads 37 are properly bonded to bumps 38 and if the electrical characteristics of chip 40 meet specifications. Segment 16 is separated from segments 14 and 18 by cutting or slicing film strip 10 at its boundaries 20 and 22. In FIG. 1 it can be seen that the boundaries 20 and 22 substantially pass through the centers of sprocket holes 12a, 12f and 12e, 12j on both sides of film strip 10. It should be noted that in the embodiment illustrated, sprocket holes 12b, 12d and 12g, 12i are respectively located on either side of reference, or datum, sprocket holes 12c and 12h of segment 16.

Figure 2:
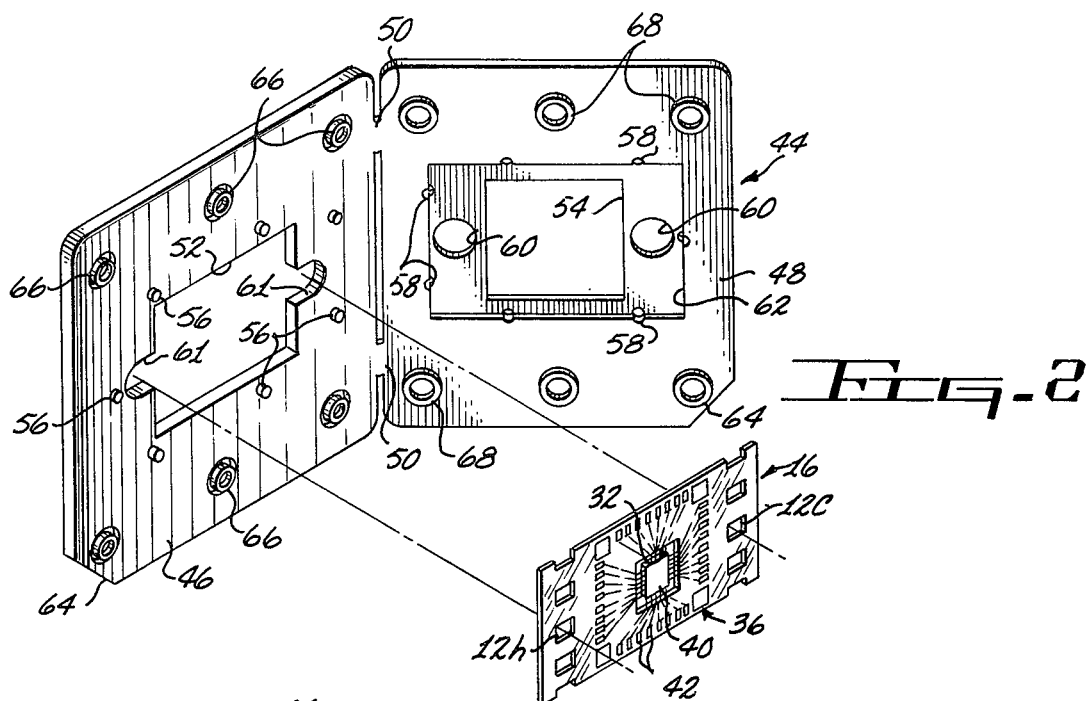
FIG. 2 is an isometric view of a fixture which can be employed for the purposes of the present invention with the segment exploded therefrom.

In FIG. 2 there is illustrated an embodiment of fixture or holder 44. Fixture 44 has a bottom laminar layer, or laminate, 46, and a top laminar layer, or laminate, 48. Layers 46, 48 are held together by hinges 50, which are made of thinner portions of the material from which layers 46, 48 are formed so that top layer 48, for example, can be folded over bottom layer 46 to hold segment 16 of film strip 10 between them as will be more fully described later. A rectangular aperture 52 is formed in layer 46 and a similar but slightly smaller aperture 54 is formed in upper layer 48. Pins, or posts, 56 are formed in layer 46 around aperture 52 and are adapted to project into openings 58 formed in the upper layer 48 when laminate 48 is folded over into contact with laminate 46. Pins 56 position or locate segment 16 properly with respect to window 52, i.e., so that the center of window 32 of segment 16 substantially coincides with the center of aperture 52. Access openings 60, in the form of circles, are formed in the upper laminar layer 48 and access openings 61, in the form of slots, are formed in laminate 46 so that when segment 16 is properly positioned between layers 46, 48 reference sprocket holes 12c, 12h of segment 16 are accessible from either side of fixture 44.

The reason access openings 61 are in the form of slots connected to aperture 52 is because the dimensions of aperture 52 are slightly larger than those of 54. The reason is that commercial equipment which is available for cutting segments from a 35 millimeter film strip and mounting a segment in a fixture, or holder, such as fixture 44 is designed for a holder the dimension of whose aperture is substantially 19.06mm × 23.2mm. Upper laminar layer 48 is provided with a recess 62 of a depth substantially equal to the thickness of film strip 10 of segment 16 so that when segment 16 is located within fixture 44 and laminar layer 48 is folded over laminar layer 46, the thickness of segment 16 does not prevent laminates 46, 48 from being in substantial contact with one another.

Fixture 44 is substantially square with one corner removed to form a polarity key 64 which, together with the location of access openings 60, 61 is used to determine the orientation of fixture 44 and, thus, of segment 16.

When the upper and lower halves of fixture 44 have been folded together with segment 16 between them, the two sides 46, 48 can be held together in any suitable manner. In the embodiment, illustrated in FIG. 2, a mechanical friction fit between a plurality of rings 66 formed on laminar layer 46 and a plurality of rings 68 formed on laminar layer 48 is sufficient to keep laminates 46 and 48 from separating during subsequent manufacturing steps. As can be seen in FIG. 2, rings 66, 68 are disposed around the periphery of laminar layers 46, 48.

Figure 3:
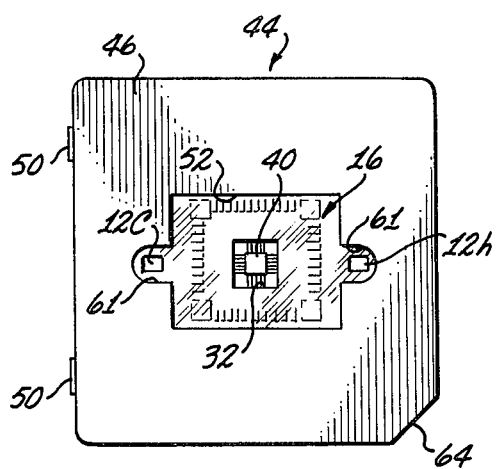
FIG. 3 is a bottom view of the fixture of FIG. 2.

After segment 16 has been severed from film strip 10, it is placed within the positioning means, posts 56 of laminar layer 46, and laminar layer 48 is folded on hinges 50 until the concentric rings 66, 68 engage. FIG. 3 is a bottom view of fixture 44 after segment 16 has been placed in it. Part of segment 16 is accessible from the bottom side of fixture 44 through aperture 52 and datum sprocket holes 12c, 12h are accessible from the bottom side of fixture 44 through access openings 61.

Figure 4:
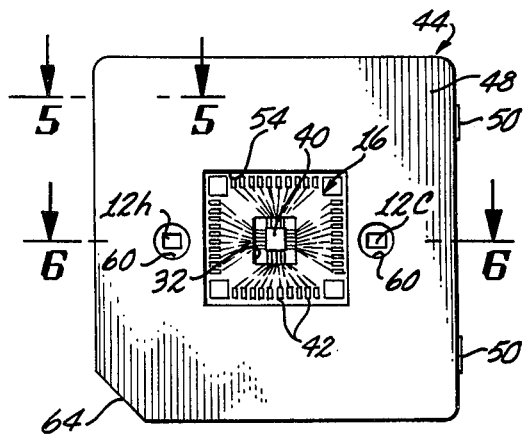
FIG. 4 is a plan view of the fixture of FIG. 2.

FIG. 4 is a plan view of fixture 44 with segment 16 held in it. A part of segment 16 is accessible from the top side of fixture 44 through aperture 54. Reference sprocket holes 12c, 12h are accessible from the top side of fixture 44 through access openings 60. Test pads 42 of the lead frame 36 are also accessible through aperture 54 of laminate 48 of fixture 44.

Figure 5:
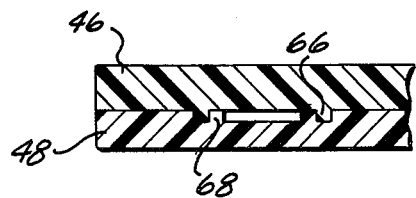
FIG. 5 is an enlarged fragmentary section taken on line 5—5 of FIG. 4.

In FIG. 5, details of the fastening means are illustrated. Rings 66 on laminate 46 frictionally engage corresponding surfaces of rings 68 of laminate 48. The locations of the rings are such that when laminate 48 is folded over into contact with laminate 46 corresponding rings 66 and 68 are substantially concentric with one another. Other means for holding laminates 46, 48 of fixture 44 may be used including a suitable adhesive.

Figure 6:
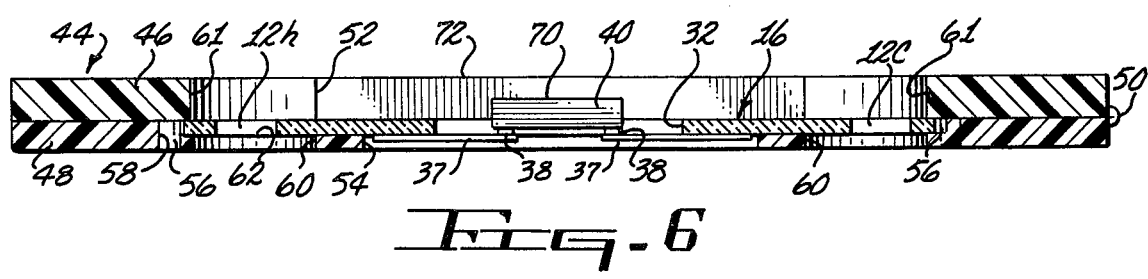
FIG. 6 is an enlarged sectional view taken on line 6—6 of FIG. 4.

Referring to FIG. 6, it can be seen that laminate 46 is thicker than laminate 48. The thickness of laminate 46 is chosen so that when a segment, such as segment 16, is positioned within fixture 44 the upper surface or base 70 of integrated circuit chip 40, which is bonded to the inner portions of leads 37, is below the outer surface 72 of laminate 46. The thickness of laminate 48 can be reduced compared to laminate 46 to minimize the overall thickness of fixture 44 while providing adequate protection for leads 37 during subsequent handling of the fixture after segment 16 has been placed in fixture 44.

The outer surfaces of the fixture 44 can have printed on them indicia identifying the type of integrated circuit chip 40 held by fixture 44, the sources of the chip, for example, and any other relevant information such as whether or not it meets all acceptance criteria. Such indicia, however, are not illustrated on the embodiments of FIGS. 2 through 6.

In FIGS. 7 through 10, another embodiment of the invention is illustrated. Fixture 74 is made of a single layer of laminar material. An aperture 76 is formed in fixture 74. On one side of fixture 74, a recess 78 is formed around aperture 76, the dimensions of recess 78 are such that a segment of film strip 10, such as segment 16, can fit within recess 78. To hold segment 16 within recess 78, projections, or lugs, 80 are formed therein. Lugs 80 frictionally engage sprocket holes 12b, 12d, 12g and 12i. The frictional forces between the lugs and the sprocket holes is sufficient to retain segment 16 within recess 78 of fixture 74, but not to create strains that might apply forces sufficient to distort the portion of the lead frame 36 extending over the window 32 of segment 16. A pair of circular access openings 82 are formed in fixture 74 so that access to the datum, or reference, sprocket holes 12c, 12h of segment 16 is possible while segment 16 is held by fixture 74. One corner of fixture 74 is removed to provide a polarity key 84 which, together with access openings 82, is sufficient to determine the orientation of fixture 74 and, thus, of segment 16.

A major advantage of fixture 74 is that it is reusable. Since it may be desirable to have fixture 74 bear appropriate indicia identifying the type of integrated circuit chip 40 mounted in fixture 74 and other relevant data about the chip, and since many materials suitable for use in fabricating fixture 74 are not well adapted for having visible indicia placed thereon which is either easily removable or rewritable a layer of magnetic material 86 may be placed on fixture 74 on which the desired information can be recorded. Magnetic material has the desirable characteristic for this application of being readily reusable.

FIG. 8 is a plan view of the holder 74 with a segment, such as segment 16, mounted within the recess 78 and held in place on holder 74 by lugs 80 which engage sprocket openings 12b, 12d, 12g and 12i of segment 16. It should be noted that the access holes 82 provide access to the reference sprocket holes 12c, 12h of segment 16. FIG. 9 illustrates the manner in which the lugs 80 retain segment 16 within recess 78 of fixture 74.

FIG. 10 illustrates how the chip 40 projects into aperture 76 of fixture 74. The thickness of portion 88 of fixture 74 immediately surrounding the aperture 76 is such that the surface 70 of chip 40 is below the surface 90 of fixture 74 so that chip 40 is protected from potential damage during subsequent manufacturing steps. Recess 78 is of sufficient depth so that the leads 37 are sufficiently above surface 92 in FIG. 10 to protect the leads from damage also during subsequent manufacturing steps, until chip 40 and part of its lead frame 36 are excised, normally immediately prior to chip 40 being mounted on a substrate, for example. It should be noted that the window 76 can be made substantially equal to, or slightly greater than the dimensions of window 32 formed in segment 16. As can be best seen in FIG. 8, test pads 42, the outer portions of leads 37 of the lead frame 36 are directly accessible from the top side of holder 74 so that it is possible to subject chip 40 to electrical tests while segment 16 is held by fixture 74. Since portion 88 of fixture 74 underlay test pads 42 of lead frame 36, it is not necessary to provide any additional physical support for test pads 42 to protect lead frame 36 from damage during such a test.

The material from which the fixtures 44 and 74 can be made is preferably a thermoplastic such as polyester, polystyrene, polypropelene, polyurethane or nylon. However, the fixtures of this invention can be made from many other materials including paper for example. Because it is formed with an integral hinge, the embodiment illustrated in FIG. 2 is essentially limited to being used once, whilst the embodiment illustrated in FIG. 7 can be used many times.

After a chip has been placed in either of the fixtures 44, 74, the chip may be tested and if it is of acceptable quality; the next step in the manufacturing process is to mount the chip on a substrate or place the chip into an appropriate package. To do this, it is necessary to sever chip 40 and part of the leads 37 from segment 16. The places where leads 37 are cut are located within window 32 of segment 16. During this severing operation, in order that leads 37 will be cut at the proper place, the equipment that performs this function uses the reference sprocket holes 12c, 12h to locate segment 16 properly with respect to the cutting means to do this.

Reference sprocket holes 12c, 12h are used whenever a critical operation is to be performed with respect to a segment 16. These particular critical steps normally are the forming of a window 32 in a segment, the forming of a lead frame 36, the bonding of a chip 40 to a lead frame 36, the testing of the bonding of the leads to the chip, the testing of the chip itself, and the removal of a chip and a portion of its frame preparatory to their being mounted on a substrate or in a package.

In the foregoing, it is apparent that the fixtures constituting this invention provide a device for holding a segment of a film strip having a lead frame affixed to the strip and with an integrated circuit chip, or die, bonded to the lead frame. The fixture protects the IC chip and the lead frame from being damaged during manufacturing steps between the step of mounting the segment in the holder and the removal of a chip and a portion of its lead frame from their segment preparatory to the chip being mounted on a substrate or in an appropriate package. These fixtures permit ready access to the die, or chip, the portion of the lead frame used to electrically connect the die to an electrical circuit, and the reference sprocket holes of the segment so that the manufacturing process steps can be automated more economically and with the necessary degree of precision.

It should be evident that various modifications can be made to the described embodiments without departing from the scope of the present invention.

What is claimed is:

1. A fixture for a segment of a film strip, said segment having a lead frame affixed to the segment and an integrated circuit chip bonded to the lead frame,
    said segment having reference sprocket holes formed therein,
    a window formed in each segment, the window having a predetermined position relative to the reference sprocket holes,
    the lead frame having a plurality of electrically distinct leads, each lead having outer portions and inner portions, the outer portion of each of the leads being secured to the segment and the inner portion of each lead extending over the window, the leads having a predetermined position relative to the reference sprocket holes, and
    the integrated circuit chip being bonded to inner portions of leads of the lead frame, and being positioned in the window;
    said fixture comprising:
    a laminar layer, an aperture in said layer, the dimensions of the aperture being substantially equal to or greater than the dimensions of the window in said segment but substantially less than the dimensions of said segment;
    means forming access openings formed in said fixture, said access openings being located to permit access to the reference sprocket holes of a segment when positioned in said fixture;
    positioning means on the laminar layer adapted to position a segment so that the window of the segment is accessible through the aperture of the laminar layer; and
    means for retaining a segment in said position and for providing access to the chip, the lead frame, and the reference sprocket holes.

2. In combination:
    a segment of a film strip, said film strip having rows of sprocket holes formed therein, one row on each side, with one sprocket hole in each row being a reference sprocket hole:
    means forming a window in each segment, the window having a fixed position relative to the reference sprocket holes;
    a lead frame, said lead frame having a plurality of leads, each lead having an outer portion and an inner portion, the outer portion of each of the leads being secured to the segment and the inner portion of each lead extending over the window, the leads having a predetermined position relative to the reference sprocket holes;
    an integrated circuit chip, said chip being bonded to inner portions of the leads of the lead frame, and being positioned within the window;
    a fixture comprising a laminar layer,
    means forming an aperture in said layer, the dimensions of the aperture being substantially equal to or greater than the dimensions of the window in said segment but less than the dimensions of said segment;
    positioning means integral with the laminar layer for positioning the segment so that the window of the segment is accessible through the aperture, said segment being positioned by said positioning means;
    means forming access openings in said fixture, said access openings being located to permit access to the reference sprocket holes of the segment positioned on said fixture; and
    means for retaining the segment in said position said means providing access to the lead frame and reference sprocket holes of the segment.

3. A fixture for a segment of a film strip having a lead frame attached to the segment and an integrated circuit chip bonded to the lead frame;
    said segment having reference sprocket holes formed therein, one on each side thereof;
    a window formed in each segment, said window having a position fixed with respect to the reference sprocket holes;
    the lead frame having a plurality of leads each lead having an inner and an outer portion, the outer portions being secured to the segment and the inner portions extending over the window;
    the integrated circuit chip being bonded to inner portions of the leads so that the chip is positioned substantially within the window of the segment;
    said fixture comprising:
    first and second laminar layers, the second laminar layer being hinged to the first layer, each layer having an aperture formed therein with each aperture having a center;
    positioning means integral with said first layer for positioning a segment of film strip so that the window of the segment is centrally located within the apertures formed in the first layer of the fixture when the laminar layers are folded together;
    means for securing the first and second layers together so the center of the aperture in the second layer substantially coincides with the center of the aperture in the first layer, and access openings formed in both layers, to provide access to reference sprocket holes of a segment positioned in said fixture.

4. The fixture of claim 3 in which one laminar layer is thicker than the other.

5. The fixture of claim 4 in which the positioning means is a plurality of posts mounted on a laminar layer.

6. The fixture of claim 5 in which a laminar layer is provided with means forming a recess, the depth of which is substantially equal to the thickness of the segment.

7. The fixture of claim 6 in which the laminar layers are formed of a thermoplastic material.

8. In combination:

a segment of a laminate having substantially planar surfaces;

means forming rows of sprocket holes on each side of a segment with one sprocket hole of each row being a datum sprocket hole;

means forming a window in said segment, said window having a predetermined position with respect to the datum sprocket holes;

a lead frame affixed to the segment, the lead frame comprising a plurality of leads having inner and outer portions, the outer portions of the leads being secured to the segment and the inner portions extending over the window;

an integrated circuit chip, said chip being attached to the inner portions of the leads and being positioned substantially within the window formed in the segment;

a fixture, said fixture comprising a first laminar layer and a second laminar layer, the laminar layers being hinged together so that one layer can be folded over the other;

each layer having means forming an aperture of predetermined configuration in each layer;

positioning means formed on said first layer for positioning said segment so that the window of the segment is substantially centrally located within the aperture formed in the first laminar layer of the fixture, said segment being positioned by said positioning means;

means for securing the first and second laminar layers together with the segment between them, the apertures of the first and second layers being in substantial registration with each other; and means forming apertures in both layers to provide access to the datum sprocket holes of the segment.

9. The combination of claim 8 in which the first laminar layer is thicker than the second.

10. The combination of claim 9 in which the positioning means is a plurality of posts mounted on the first laminar layer.

11. The combination of claim 10 in which the second laminar layer is provided with recess means of a depth substantially equal to the thickness of the segment.

12. The combination of claim 11 in which the laminar layers are formed of a thermoplastic material.

13. A fixture for a segment of laminate having substantially planar surfaces with a lead frame attached to the segment and an integrated circuit chip bonded to the lead frame, said segment having sprocket holes on each side with one sprocket hole on each side being a datum sprocket hole, means forming a window in said segment, said window having a position fixed relative to the datum sprocket holes; the lead frame comprising a plurality of leads having inner and outer portions, the outer portions of the leads being secured to the segment and the inner portions extending over the window; and the integrated circuit chip being attached to inner portions of at least some of the leads so that the chip is substantially positioned within the window of the segment;

said fixture comprising;

a laminar layer;

means forming an aperture in said laminar layer, the dimensions of said aperture being in the range of from substantially equal to the dimensions of the window formed in a segment to the dimensions of a lead frame attached to the segment;

recess means surrounding said aperture, the dimensions of the recess being such as to receive a segment and position the segment relative to said aperture;

means located in said recess for engaging selected ones of the sprocket holes in a segment other than the datum sprocket holes for holding a segment in the recess; and means forming access openings in said fixture for providing access to the datum sprocket holes of a segment.

14. The fixture of claim 13 in which the means for engaging selected ones of said sprocket holes are lugs integral with said laminar layer.

15. The fixture of claim 14 in which the laminar layer is made of a thermoplastic material.

16. The fixture of claim 15 in which the laminar layer is provided with a polarity key.

17. The fixture of claim 16 in which the laminar layer is provided with means for recording indicia.

18. In combination:

a segment of a film strip;

said segment having a plurality of sprocket holes formed in rows therein, one row on each side of the segment, one sprocket hole of each row being a reference sprocket hole;

a window formed in each segment, said window having a predetermined position with respect to the reference sprocket holes;

a lead frame having a plurality of leads, said leads having inner and outer portions, the outer portions of the leads being secured to the segment and the inner portions extending over the window;

an integrated circuit chip attached to the inner portions of at least some leads so that the chip is positioned substantially within the window of the segment;

a fixture for the segment, said fixture comprising a laminar layer;

means forming an aperture in said laminar layer;

means forming a recess in said laminar layer surrounding said means forming an aperture, the dimensions of the recess being such as to receive and position a segment so that the window of the segment is accessible through the aperture in the fixture, said segment being so positioned in said segment;

means in said recess for engaging sprocket holes in the segment other than the reference sprocket holes to maintain the segment in said recess; and means forming access openings in said laminar layer to provide access to the reference sprocket holes of the segment positioned and retained in said recess.

19. The combination of claim 18 in which the means for engaging selected ones of said sprocket holes are lugs integral with said laminar layer.

20. The combination of claim 19 in which the laminar layer is made of thermoplastic material.

21. The combination of claim 20 in which the laminar layer is provided with a polarity key.

22. The combination of claim 21 in which the laminar layer is provided magnetic means for recording indicia.

* * * * *